United States Patent [19]

Dabrowski et al.

[11] Patent Number: 5,374,611
[45] Date of Patent: Dec. 20, 1994

[54] PREPARATION AND COMPOSITION OF SUPERCONDUCTING COPPER OXIDES BASED ON GA-O LAYERS

[75] Inventors: Bogdan Dabrowski, Bolingbrook, Ill.; J. T. Vaughey, Houston, Tex.; Kenneth R. Poeppelmeier, Evanston, Ill.

[73] Assignees: The University of Chicago, Chicago; Northwestern University, Evanston, both of Ill.

[21] Appl. No.: 956,844

[22] Filed: Oct. 1, 1992

[51] Int. Cl.$^5$ .................. H01B 1/00; H01B 12/00; H01L 39/12
[52] U.S. Cl. .................. 505/500; 505/777; 505/778; 505/482; 505/125; 252/518; 252/521
[58] Field of Search ............. 252/518, 521; 505/1, 505/777, 778

[56] References Cited

U.S. PATENT DOCUMENTS 5,024,992 6/1991 Morris .................. 505/1

OTHER PUBLICATIONS

Koike "Anomalous X Dependence of Tc and Possibility of Low-Temperature Structural Phase Transition in $La_{2-x}Sr_xCu_{0.99}M_{0.01}O_4$..." *Solid State Comm* v. 82 (11) Jun. 1992 pp. 889–893.

Dravid "Hole Formation and Charge Transfer in $Y_{1-x}Ca_xSr_2Cu_2GaO_3$..." *Physica C* v. 200 Oct. 1, 1992 pp. 349–358.

Vaughey, et al., Synthesis and Structure of a New Family of Cuprate Superconductors: $LnSr_2Cu_2GaO_7$, Chemistr of Materials, Sep./Oct., 1991, pp. 935–940.

Poeppelmeier, et al., New Family of Planar Cuprate Superconductors: Effect of Nonmagnetic Chains and Planes, Physica C., Dec. 1991, pp. 525–526.

Dabrowski, et al., New Family of Superconducting Copper Oxides: $GaSr_2Ln_{1-x}Ca_xCu_2O_7$, Physica C, Apr. 1992, pp. 62–67.

Dabrowski, et al., Synthesis and Properties of New Superconducting Copper Oxides: $GaSr_2Ln_{1-x}Ca_xCu_2O_7$ and $Ga_{1-y}Sr_2YCu_{2+y}O_7$, The International Workshop on Superconductivity, Jun., 1992 pp. 330–331.

*Primary Examiner*—Paul Lieberman
*Assistant Examiner*—M. Kopec
*Attorney, Agent, or Firm*—Reinhart, Boerner, Van Deuren, Norris & Rieselbach

[57] ABSTRACT

A high temperature superconducting material with the general formula $GaSr_2Ln_{1-x}M_xCu_2O_{7\pm w}$ wherein Ln is selected from the group consisting of La, Ce, Pt, Sm, Eu, Gd, Tb, Dy, Ho, Er, Tm, Yb and Y and M is selected from the group consisting of Ca and Sr, $0.2 \leq x \leq 0.4$ and w is a small fraction of one. A method of preparing this high temperature superconducting material is provided which includes heating and cooling a mixture to produce a crystalline material which is subsequently fired, ground and annealed at high pressure and temperature in oxygen to establish superconductivity.

17 Claims, 7 Drawing Sheets

GaO
A: SrO
CuO$_2$
A: Y/Ca
CuO$_2$

PREPARATION AND COMPOSITION OF SUPERCONDUCTING COPPER OXIDES BASED ON GA-O LAYERS

CONTRACTUAL ORIGIN OF THE INVENTION

The United States Government has rights in this invention pursuant to Contract No. W-31-109-ENG-38 between the U.S. Department of Energy and The University of Chicago, representing Argonne National Laboratory.

BACKGROUND OF THE INVENTION

The present invention is directed to new compositions of matter and methods of preparation of high temperature superconducting copper oxides. More particularly, the invention is directed to high temperature superconducting materials with the general formulae of (1) $GaSr_2Ln_{1-x}M_xCu_2O_{7\pm w}$ (M=Ca and Sr, Ln=La, Ce, Pr, Sm, Eu, Gd, Tb, Dy, Ho, Er, Tm, Yb and Y; $0.2 \leq x \leq 0.4$ and w is a small fraction of one) and of (2) $Ga_{1-y}Sr_2YCu_{2+y}O_{7\pm w}$ (where y is about 0.65 and less).

All known high temperature superconducting copper oxides have an anisotropic structure containing two-dimensional $CuO_2$ layers with square planar, square pyramidal and octahedral coordination of the copper to oxygen. These $CuO_2$ layers are bounded in the third dimension by metal-oxygen layers ("AO" hereinafter) containing large and strongly ionic metal ions (A-Ba, Sr and La-Gd), which form $AO-CuO_2-AO$ structural blocks. For most superconducting compounds there is frequently more than one $CuO_2$ layer, separated by metal layers, A' (A'=Ca, lanthanides and Y), which are within the block, and an additional layer of mixed oxidation state cations, covalently bonded to oxygen, between these blocks (e.g., structures based on Cu, Tl, Pb and Bi). In previous attempts, the synthesis of layered copper oxides with more ionic, fixed oxidation state, cations in this additional layer has led to nonsuperconducting materials.

The importance of copper-oxygen layers in the high-temperature ($T_c > 35K$) superconductors was realized in 1986 after the report by Bednorz and Muller on their work in the La-Ba-Cu-O system. The conducting planes ($CuO_{4/2}$) of these materials result from the hybridization of the Cu(3d) and O(2p) orbitals which form closely and symmetrically coordinated copper and oxygen atoms in square nets. Other families of superconductors are $La_{2-x}M_xCuO_4$ (M=$Ca^{2+}$, $Sr^{2+}$, $Ba2+$), $Nd_{2-x}Ce_xCuO_4$, $YBa_2Cu_3O_{7-x}$ (Tl, Bi)$_m$(Ba,Sr)$_2Ca_{n-1}Cu_nO_{m+2n+2}$ (m,n=integers) , $Pb_2Sr_2LnCu_3O_{8+x}$ (Ln=lanthanides), and $La_{2-x}Sr_xCaCu_2O_6$. All of these compounds can be described as an intergrowth of AO rocksalt layers with $ABO_{3-x}$ perovskite units and have the general formula $(AO)_m(ABO_{3-x})_n$ where m and n are integers and B is copper. Although no theory on the mechanism of high temperature superconductivity has gained acceptance, the observation of high-temperature superconductivity in this class of layered materials has led to a phenomenological understanding that superconductivity depends on the two-dimensional conducting planes with weak interplane coupling.

The influence of substitutions on superconductivity has been studied in great detail in $YBa_2Cu_3O_{7-x}$. All lanthanides have been substituted into the eight-coordinate yttrium position. With the exception of praseodymium, superconductivity is preserved. In contrast, the addition of small amounts of a transition or post-transition metal onto either the square-planar or square-pyramidal copper site generally resulted in the loss of superconductivity. Incorporation of the trivalent cations aluminium, iron, and cobalt is believed to occur on the square-planar copper site, whereas chromium or zinc is thought to go into the planes. When large amounts of gallium or aluminium are incorporated, the new single-layer copper compounds $LaSrCuAlO_5$ and $LaSrCuGaO_5$ with the brownmillerite ($Ca_2FeAlO_5$) structure are formed. These structures reflect the preference for tetrahedral coordination by the group thirteen elements. While enormous efforts have been expended in the industry, there have been only several new systems discovered for these types of structures.

It is therefore an object of the invention to provide a novel composition and method of manufacture of high temperature superconducting ceramic.

It is another object of the invention to provide an improved composition of high temperature ceramic superconductor based on $GaSr_2Ln_{1-x}M_xCu_2O_{7\pm w}$ wherein M=Ca and Sr and Ln=La, Ce, Pr, Sm, Eu, Gd, Tb, Dy, Ho, Er, Tm, Yb, and Y.

It is yet a further object of the invention to provide a novel composition of high temperature ceramic superconductor comprised of $Ga_{1-y}Sr_2YCu_{2+y}O_{7\pm w}$ wherein y is less than or equal to about 0.65.

It is a further object of the invention to provide a novel method of making a high temperature ceramic superconductor under highly oxidizing atmospheres.

It is an additional object of the invention to provide an improved composition and method of making a gallium containing high temperature ceramic superconductor.

It is yet another object of the invention to provide a novel method of oxidizing a ceramic superconductor to activate the superconducting state of matter.

It is a further object of the invention to provide an improved method of modifying the crystallographic structure of a copper oxide based superconductor to introduce adequate electronic charge into the $Cu_2O$ layers to establish superconductivity.

It is still another object of the invention to provide a novel method of hole doping of $Cu_2O$ layers of a high temperature ceramic superconductor.

Other objects and advantages of the invention together with the method of manufacture and product composition will become apparent from the following Detailed Description and Brief Description of the Drawings hereinbelow.

DETAILED DESCRIPTION OF PREFERRED EMBODIMENTS

The well known high temperature superconducting copper oxide, $LnBa_2Cu_3O_{7\pm w}$, contains square planar coordinated copper ions in the layer (frequently referred to as the chain region) between the $AO\text{-}CuO_2\text{-}A'\text{-}CuO_2\text{-}AO$ blocks. It is possible to nearly completely substitute the square planar copper site with cobalt. For compositions in which Ln-La, tantalum and niobium substitutions resulted in the distinct, but very similar, $LaBa_2TaCu_2O_8$ structure with octahedrally coordinated Nb and Ta. The existence of the latter structure shows the importance of the coordination preference of small ions in the formation of ordered layered compounds, as opposed to mixing of these ions with copper within one layer For $AA'BCuO_{6-w}$ (B=transition or post-transition metal) compounds several new layered structures were discovered (e.g., single $CuO_2$ layer $AlSrLaCuO_5$, $GaSrLaCuO_5$ and $SnLa_2CuO_6$, and double $CuO_2$ layer $AlSr_2LnCu_2O_7$, $FeSr_2LnCu_2O_7$ and $GaSr_2LnCu_2O_7$).

Figure 1:
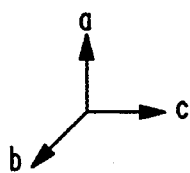
FIG. 1 illustrates the crystalline structure of $LnSr_2Cu_2GaO_7$.
Figure 1:
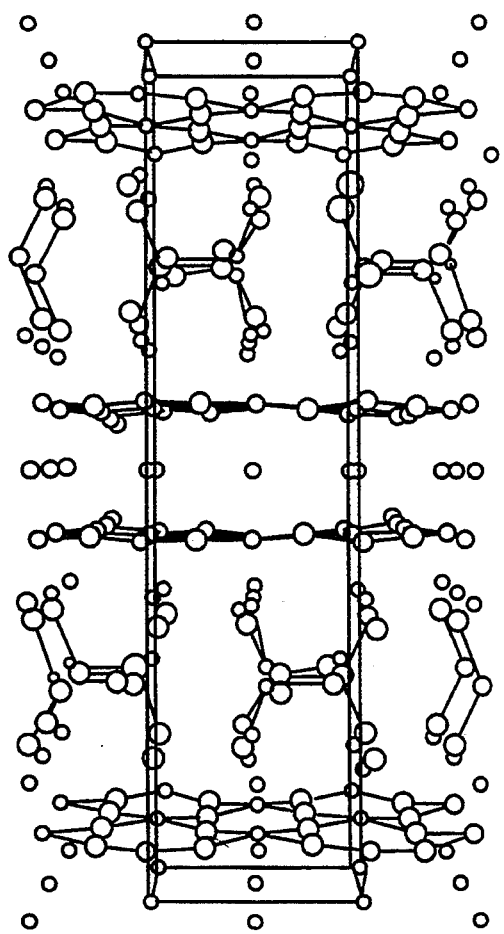

The orthorhombic structure of $GaSr_2LnCu_2O_7$ (non-centrosymmetric space group Ima2, No. 46), as determined from powder neutron and single-crystal X-ray diffraction data is similar to $LnBa_2Cu_3O_{7-w}$ (see FIG. 1). The square-planar copper layer of $LnBa_2Cu_3O_{7-w}$ is replaced by a layer of gallium tetrahedrally coordinated to oxygen. The large lanthanides and Sr are distributed over the two A and A'-cation sites, whereas the smaller lanthanides occupy only the A' site between the copper planes within the double $CuO_2$ layer. In the instant invention the Ca-substituted $GaSr_2LnCu_2O_7$ compositions have been synthesized under high oxygen pressure such that the combined calcium and oxygen doping introduces the necessary charge to the $CuO_2$ layers and makes the material superconducting.

Polycrystalline samples of $GaSr_2Ln_{1-x}Ca_xCu_2O_7$ ($0 \leq x \leq 0.4$) were synthesized from stoichiometric mixture of oxides and carbonates in air at 980° C. followed by relatively rapid cooling to room temperature. Samples were fired for three weeks with frequent intermediate grindings. High pressure annealing was done for 24 hours in pure oxygen using 200–500 atm. at roughly 910°–980° C. for powdered and pressed pellet samples. Lattice parameters were determined from powder X-ray diffraction using Rietveld refinement. Susceptibility measurements were performed using Squid (Quantum Design Corp. MPMS) and an a.c. (Lake Shore Cryotronics) susceptometers, respectively. Resistivity was measured using a standard four-lead d.c. measurement. Thermogravimetric measurements were performed using a Cahn TG171 system.

Air cooled samples with compositions $0 \leq x \leq 0.25$ for Ln-Y are single-phase. Larger doping levels led to the presence of small amounts of unidentified impurity phases. In general, a very small contraction of the in-plane and an expansion of the out-of-plane lattice parameters were observed with increasing doping. The high pressure annealed samples show a decreased amount of impurity phase for $x \geq 20.25$ and noticeable contraction of the in-plane lattice parameters, indicating an increased hole-doping of the $CuO_2$ planes.

Figure 2A:
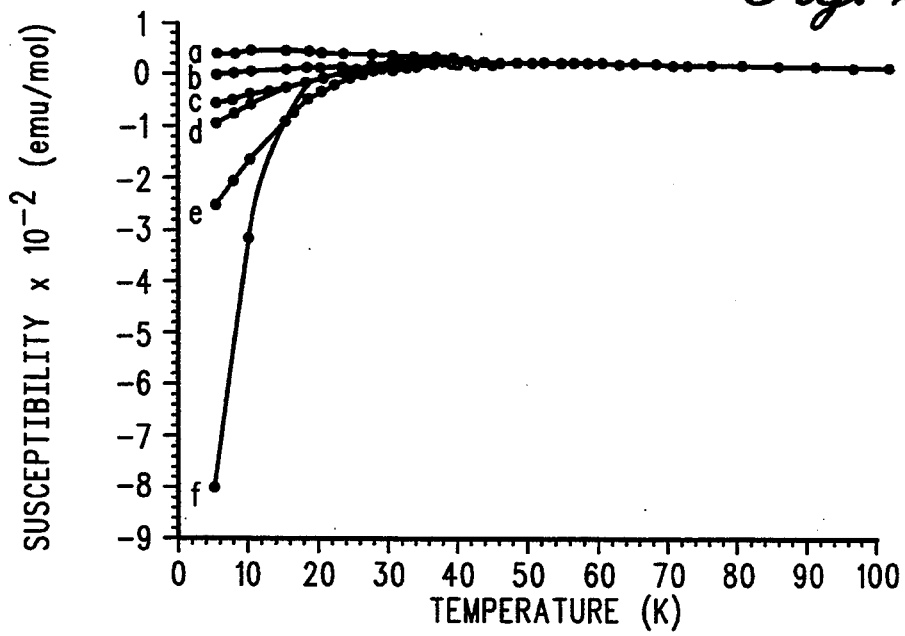
FIG. 2A shows Squid susceptibility for dense x=o (a), 0.1 (b), 0.15 (c), 0.20 (d), 0.25 (e) and 0.35 (f) samples annealed at 925° C.
Figure 2B:
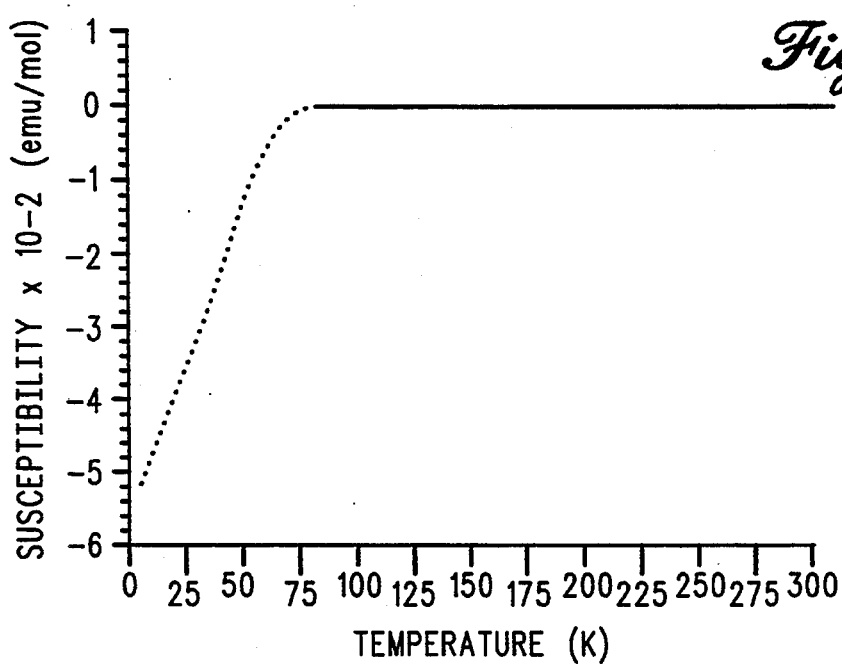
FIG. 2B shows susceptibility for an x=0.30 to 0.35 powder sample.
Figure 3:
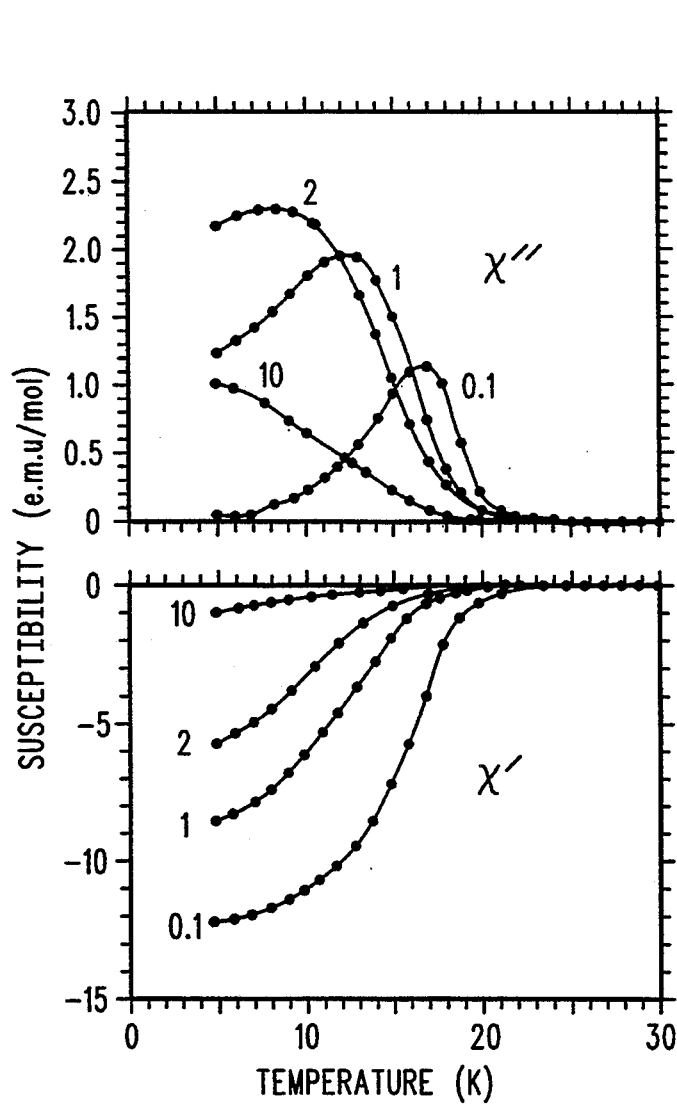
FIG. 3 shows the real and imaginary a.c. susceptibility for an x=0.35 dense sample for various values of the a.c. field.

High sensitivity zero field cooled Squid susceptibility measurements using 100 Gauss were done for both powder and pellet high pressure annealed samples. For the dense pellets annealed in pressure of about 300 atmospheres at 925° C., a gradual development of a superconducting phase with an almost fixed transition temperature, $T_c \sim 20\text{-}25K$, was observed with increased doping as shown on FIG. 2A. For powder samples annealed in 200 atm. oxygen at 910° C., different Tc's were observed with the highest $T_c=73K$ for x=0.3 (see FIG. 2). FIG. 3 shows real and imaginary a.c. susceptibility for a x=0.35 dense sample for various values of the a.c. field. Clearly, for low fields, $\leq 1$ Gauss, the sample shows full diamagnetic behavior, proving that for this composition a large fraction of the sample becomes superconducting. Similar a.c. field dependence of the measured superconducting phase fraction was observed for the other compositions for either dense pellets or loose powders. The a.c. data also shows very good agreement for the onset $T_c$ measured with the Squid.

Figure 4:
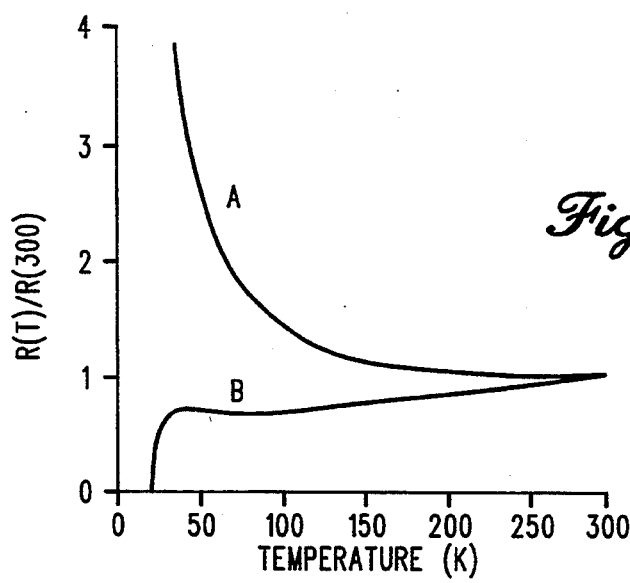
FIG. 4 shows exemplary resistivity as a function of temperature for fast cooled (A) and high pressure oxygen annealed (B) for x=0.35 dense samples.
Figure 5A:
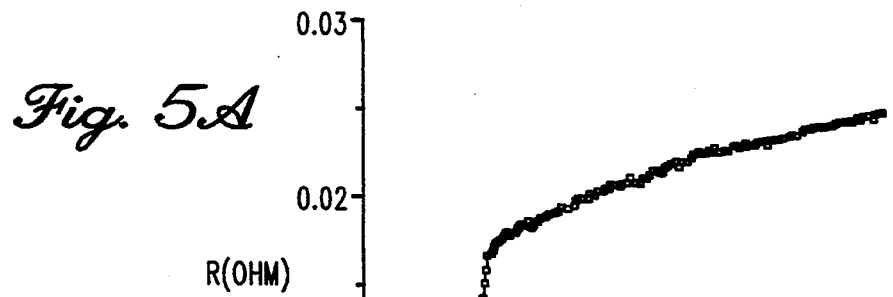
FIG. 5A illustrates resistance behavior as a function of temperature for $GaSr_2Ln_{1-x}M_xCu_2O_{7\pm w}$ annealed at 600 atmospheres of oxygen at 1100° C.
Figure 5B:
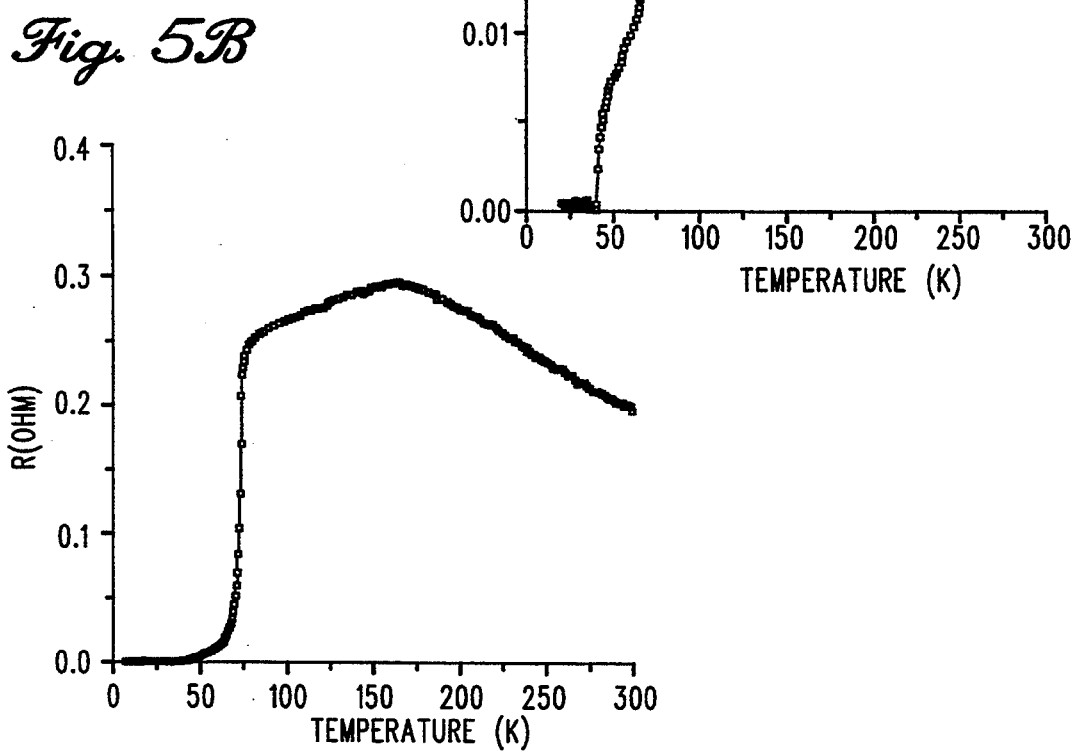
FIG. 5B shows resistance behavior as a function of temperatures for samples prepared in a two step process.

Resistive measurements confirm superconductivity for the high pressure annealed material. Typical R vs. T data for the fast cooled (A) and high pressure oxygen annealed (B) x=0.35 dense samples is shown on FIG. 4. The resistivity changes from semiconductor-like to metallic when the sample is annealed under increasingly oxidizing conditions. The resulting substantially linear dependence of resistivity on temperature is the same as observed for all other high temperature superconductors. Samples annealed at the highest pressure and temperature (600 atm. oxygen at 1100° C.) show the preferred superconducting properties (see FIG. 5A and see also FIG. 6). FIG. 5A illustrates resistance for a specimen subjected to elevated annealing temperatures, slightly above the melting point of about 1100° C. (normally at atmospheric pressure $T_{mp}$ is about 1000° C). In FIG. 5B is shown resistance behavior for a sample which was synthesized in a 2 % oxygen, balance argon, atmosphere at 975° C. and then annealed at 270 atmospheres oxygen at 940° C. The specimen was cooled at less than about 1° C. per minute.

Superconductivity in the $GaSr_2Ln_{1-x}Ca_xCu_2O_7$ system was determined not to be limited to Ln=Y. Superconducting transitions up to 75° K. have been observed for Ln=La, Nd, Dy and Yb, which ranges from the largest to the smallest lanthanide ions that form the structure. For other Ln ions, there are no known superconducting phases containing Sr, Ca, Ln and Cu which can be prepared under the instant synthesis conditions. To verify that the presence of gallium is a necessity condition for superconductivity, several samples have been prepared without Ga and processed under the same conditions as the Ga-containing material. None of these samples showed any traces of either superconductivity or metallic behavior.

The reduced amount of impurity phase after high pressure treatment indicates that some additional Ca was incorporated into the compound, but the samples did not achieve the preferable full equilibrium during the 24-hour anneal at 910°–925° C. Therefore, although superconducting material was obtained during these lower temperature anneals, higher pressures and temperatures (up to melting ~1000° C.) favored formation of the most preferred high quality superconducting material (low contamination and substantially all material in the superconducting state of matter). From thermogravimetric analysis there is a clear indication that the oxygen content increases slightly during cooling in oxygen over an extended temperature range (from about 950° C. to ~800° C.). The cooling rates are most preferably quite slow, for example, about <1° C./min., for maximum oxygen uptake, especially for dense samples.

Without limiting the scope of the instant invention, it is believed the compositions of interest provide a layered superconducting copper oxide with small, fixed oxidation state cations separating the conducting $AO$-$CuO_2$-$A'$-$CuO_2$-$AO$ blocks, such as, $GaSr_2Ln_{1-x}Ca_xCu_2O_7$. Several similar materials, with less ionic (e.g., FeO and SnO) or more ionic (e.g., AlO, NbO and TaO) layers can also become superconducting once doped and annealed under the previously described strongly oxidizing conditions.

In another embodiment of the invention the composition of interest comprises $Ga_{1-y}Sr_2Y_{1-x}Ca_xCu_{2+y}O_{7\pm w}$. Polycrystalline samples were prepared for $0 \leq y \leq 0.7$ from substantially stoichiometric mixture of oxides and carbonates in air at about 980° C. High pressure oxygen annealing was performed for 24 hours using about 200 to 300 atm. of pure oxygen at 940° C. followed by slow cooling at about 1° C./minute. Further details of preparation are set forth in the Examples. For this composition of invention, the optimum superconducting properties were obtained for y values of about 0.6–0.65.

Figure 10:
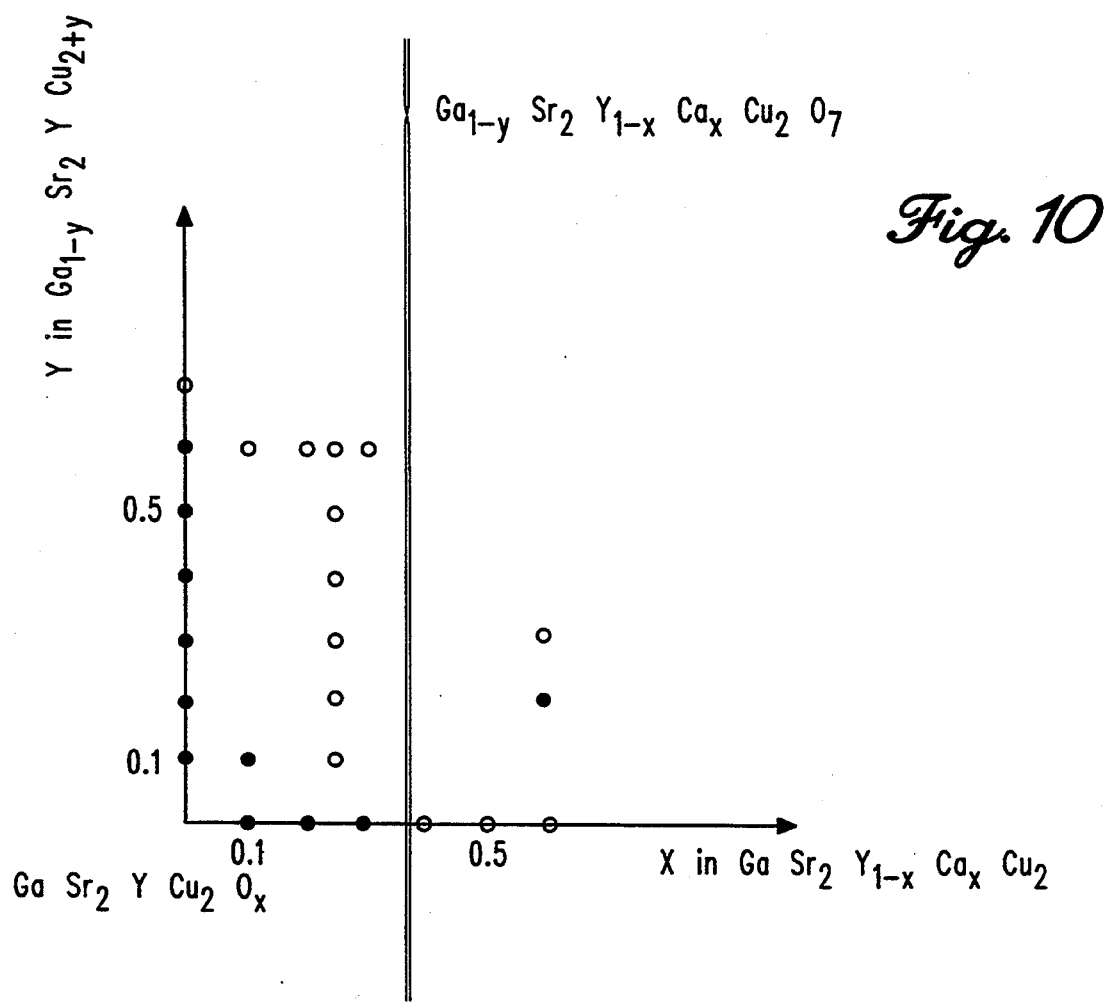
FIG. 10 illustrates a composition diagram for the $Ga_{1-y}Sr_2Y_{1-x}Ca_xCu_{2+y}O_7$ system.

As described hereinbefore for the other system, the crystallographic structure is the orthorhombic structure (noncentrosymmetric space group Ima2, No. 46) of the parent compound, $GaSr_2LnCu_2O_7$ which is similar to $LnBa_2Cu_3O_7$ (see FIG. 1). The solubility limits for Ca substitution on the Y-site and Cu substitution on the Ga-site are x of about 0.25 and y of about 0.65, respectively, for air-synthesized samples. These limits are slightly increased for high pressure annealed material. The two substitutions can be clearly distinguished by X-ray diffraction data. For Ca substitution, the in-plane lattice parameters (b of about 5.5 Angstroms and c of about 5.4 Angstroms) decrease while the out-of-plane lattice parameter (a of about 22.8 Angstroms) does not appreciably change. For Cu substitution, the structure changes such that compositions beyond y of about 0.3 are tetragonal. The other substitution of Ca for Sr (which is up to at least about 50%) results in a considerable reduction of the "a" lattice parameter. A composition diagram for $Ga_{1-y}Sr_2Y_{1-x}Ca_xCu_{2+y}O_7$ is shown in FIG. 10.

The best superconducting properties for both of the systems described herein are found generally near the solubility limits for both substitutions. For these compositions, resistivity measurements show superconductivity for the high pressure annealed material (see FIG. 6). The resistance can be seen to change from semiconductor-like to metallic when the samples are annealed under increasingly oxidizing conditions. The almost linear dependence of resistance on temperature is the same as observed for all other high temperature superconductors. The bulk superconductivity (10–40%) was confirmed with d.c Squid and a.c. susceptibility measurements.

EXAMPLES

The following nonlimiting example procedures and example products provide illustrations of various parameters of the invention.

NEUTRON DIFFRACTION

Figure 7:
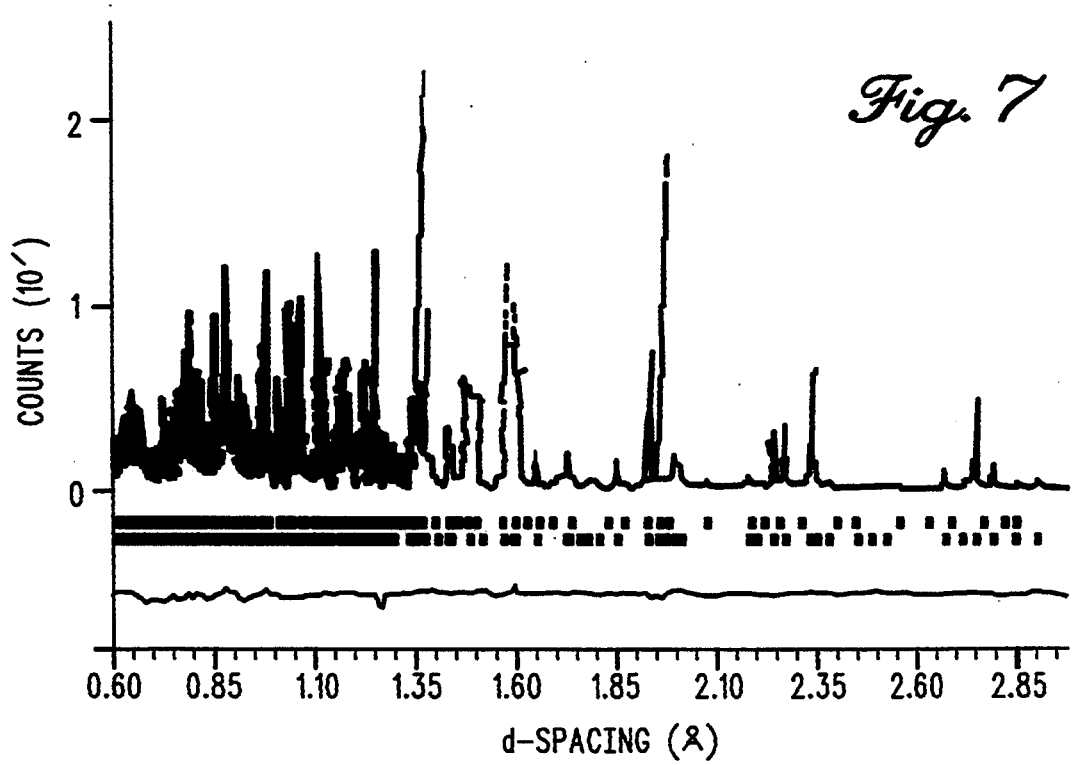
FIG. 7 illustrates the observed (+), calculated (solid line) and difference (below) neutron diffraction pattern for $LaSr_2Cu_2GaO_7$ at room temperature.

A polycrystalline sample of $LaSr_xCu_2GaO_7$ was prepared by heating stoichiometric amounts of $La_2O_3$ (Aldrich, 99.99%), $SrCO_2$ (Aldrich 99.99%) $Ga_2O_3$ (Aldrich 99.99%), and CuO (Aldrich, 99.999%). The sample was heated at 980° C. for two months with intermittent grindings. A time-of-flight data set was collected at room temperature and ambient pressure at the Intense Pulse Neutron Source (IPNS) facility at Argonne National Laboratory. Approximately 8 grams of the sample was contained in a thin-walled vanadium can, and data were collected for six hours. The data from 0.568 to 2.8931 Å were used to refine the structure. The unit cell was determined by using a nonlinear least-squares Marquet method to fit the peaks to an exponential rise and fall, convoluted into a Gaussian shape, which is characteristic of the spallation neutron source. The sample was essentially single phase, with a small $LaSrCuGaO_5$ (<5%) impurity. A unit cell was determined from the peak positions by using the conventional computer program TREOR and refined with the conventional program POLSQ to a 23.160 (2) Angstroms x 5.5706 (6) Angstroms x 5.4682 (8) Angsttoms orthorhombic cell. The indexation revealed that body centering was one of the reflection conditions. The structure of $LaSr_xCu_2GaO_7$ was solved by trial and error using a cell similar to $YBa_2Cu_3O_7$ as a starting model. The space group chosen was the noncentrosymmetric space group Ima2 (No. 46), because it allowed all of the atoms to be fully ordered. The structure was refined by the Rietveld method. The scattering lengths used were 8.24, 7.02, 7.718, 7.288, and 5.803 fm, for the lanthanum, strontium, copper, gallium, and oxygen atoms, respectively. A total of fifty-one parameters were refined. In the final cycle all parameters were allowed to refine undamped, including the scale factor, six peak-shape parameters, five background parameters, the unit-cell parameters, positional, and isotropic thermal factors, the zero-point shift, and the diffractometer constant, as well as the absorption and extinction parameters. The atomic positions are shown in Table I. The final R factor was 3.29% (4.62$R_{wtd}$). The observed and calculated diffraction patterns and difference plot from 0.60 Angstroms$\leq d \leq$2.98 Angstroms are shown in FIG. 7.

TABLE I

Atomic Positions for LaSr$_2$Cu$_2$GaO$_7$*

| atom | Wyckoff sym | x | y | z | $\beta$, Å$^2$ | occ |
|---|---|---|---|---|---|---|
| La(1) | 4a | 0 | 0 | 0 | 0.45(3) | 0.70(1) |
| La(2) | 8c | 0.1510(1) | 0.9859(3) | 0.9985(7) | 0.36(3) | 0.15(1) |
| Sr(1) | 8c | 0.1510(1) | 0.9859(3) | 0.9985(7) | 0.36(3) | 0.85(1) |
| Sr(2) | 4a | 0 | 0 | 0 | 0.45(3) | 0.30(1) |
| Cu | 8c | 0.0779(1) | 0.4992(3) | 0.9965(7) | 0.32(2) | 1.00 |
| Ga | 4b | 1/4 | 0.4285(3) | 0.0370(7) | 0.50(4) | 1.00 |
| O(1) | 8c | 0.0735(1) | 0.2478(1) | 0.2463(8) | 0.53(4) | 1.00 |
| O(2) | 8c | 0.0700(1) | 0.7513(7) | 0.7492(9) | 0.51(4) | 1.00 |
| O(3) | 8c | 0.1782(1) | 0.5490(3) | 0.9690(7) | 0.85(3) | 1.00 |
| O(4) | 4b | 1/4 | 0.3752(5) | 0.3820(8) | 0.89(5) | 1.00 |

*Space group Ima2 (No. 46) with a = 23.1425(9) Å, b = 5.5662(2) Å, c = 5.4648(2) Å.

During the refinement it was observed that the isotopic temperature factors of the lanthanum and strontium sites were very different, indicating site mixing of the two atoms between the two positions. The occupancies were refined to 30% strontium on the 4a site and conversely 15% lanthanum on the 8c site.

X-RAY DIFFRACTION

Single crystals of HoSr$_2$Cu$_2$GaO$_7$ were isolated as thin black plates from a flux with the initial composition HoSr$_4$Cu$_{10}$GaO$_x$. The mixture was ground thoroughly and heated to 1040° C. in air, allowed to soak for five hours, and cooled at 6° C./hour until 700° C., followed by quenching to room temperature. The crystal chosen had the dimensions 0.018 mm×0.33 mm×0.18 mm. Diffraction studies were performed on an Enraf-Nonius CAD4 diffractometer with Mo K$\alpha$ ($\lambda$=0.71069 Å) radiation. The unit cell was determined from 25 setting reflections to be a=22.696 (4) A, b=5.484 (4) A, c=5.385 (4) A. Data were collected from 2° to 90° in 2$\theta$ with the conditions −h, +k, −1. An additional data set was collected from 2° to 20° in 2$\theta$ with the conditions −h, +k, −1 to help resolve the centrosymetric/noncentrosymmetric ambiguity and aid in space group determination. An analytical absorption correction ($\mu$=365.91 cm$^{-1}$) based on six indexed crystal faces and accurately measured distances between faces was applied by using conventional TEXSAN software package. The transmission factors range from 0.022 to 0.510. Reflection conditions of hkl: h+k+l=2n, 0kl: k+l=2n; h0l: h, l=2n; hk0:h+k+2n:h00:h=2n; h00: h=2n; 0k0: k+2n; and 00l: l=2n, were consistent with the centrosymmetric space group Imma (No. 74) and the noncentrosymmetric space group Ima2 (No. 46). The data were refined in Imma and Ima2 using the complete data set consisting of all observed reflections and their Friedel opposites (790 reflections with I>3$\sigma$). Refinement of the structure in the space group Imma (No. 74) with all the significant data resulted in R/Rwt$_{wtd}$ of 13.5%/21.9%. In contrast a refinement of the noncentrosymmetric structure and its inversion were refined to R/R$_{wtd}$ values of the structure reported here of 6.07%/8.57% and for its indistinguishable inversion 6.10%/8.70%. In comparing the centrosymmetric and noncentrosymmetric solutions, the disorder in the gallium and O(4) positions required by the centric structure results in unreasonably large isotropic temperature factors for atoms O(4) and O(3). In contrast reasonable values are obtained in the noncentrosymmetric solution without disorder. The preferred structure is noncentrosymmetric and in the space group Ima2 No. 46).

The gallium metal position revealed a larger than expected temperature factor, likely indicating the presence of aluminum contamination from the alumina crucible used to grow the crystals. The position was refined with both gallium and aluminum to a more reasonable temperature factor and an aluminum content of approximately 28%, that is, the composition HoSr$_2$Cu$_2$Ga$_{0.72}$Al$_{0.28}$O$_7$. Energy-dispersive X-ray analysis (EDX) studies on single crystal from the same batch confirmed aluminum to be present in that approximate amount. In an earlier study of the one-copper-layer brownmillerite type structure LaSrCuGaO$_5$, the maximum aluminum solubility at 980° C. was found to be approximately 20%. The higher percentage of aluminum with the double-layer structure may reflect the higher temperature used for crystal growth. Crystallographic data for this compound are summarized in Tables II and III. Bond lengths and angles are presented in Table IV.

TABLE II

Summary of Crystallographic Data

| | | | |
|---|---|---|---|
| formula | HoSr$_2$Cu$_2$Ga$_{0.72}$Al$_{0.28}$O$_7$ | $\mu$, cm$^{-1}$ | 365.91 |
| formula wt | 637.010 | temp. °C. | −120 |
| cryst size | 0.018 mm × 0.33 mm × 0.18 mm | scan type | 2$\theta$/$\theta$ |
| space group | Ima2 (No. 46) | 2$\theta$ range, deg | 2-90(2-20) |
| lattice param. Å | | indexes collected | −h, +k, −1(±h, ±k, ±1) |
| a | 22.696(4) | R(R$_{wtd}$) | 0.061 (0.087) |
| b | 5.484(4) | no. of unique data | 1678 |
| c | 5.385(4) | no. of unique data with I>3$\sigma$(I) | 790 |
| vol. Å | 670.24 | no. of variables | 30 |
| Z | 4 | secondary extinction coeff | 3.609 × 10$^{-7}$ |
| calcd density, g/cm$^3$ | 6.43 | | |

TABLE III

Atomic Positions for $HoSr_2Cu_3GaO_7$

| atom | Wyckoff sym | x | y | z | $\beta, Å^2$ | occ |
|---|---|---|---|---|---|---|
| Ho | 4a | 0 | 0 | 0 | 0.27(1) | 1.00 |
| Sr | 8c | 0.8491(1) | 0.0167(2) | 0.085(7) | 0.30(2) | 1.00 |
| Cu | 8c | 0.9265(8) | 0.5008(3) | 0.997(1) | 0.21(2) | 1.00 |
| Ga | 4b | 1/4 | 0.5710(6) | 0.9574(8) | 0.41(6) | 0.72(1) |
| Al | 4b | 1/4 | 0.5710(6) | 0.9574(8) | 0.41(6) | 0.28(1) |
| O(1) | 8c | 0.9362(6) | 0.762(2) | 0.760(4) | 0.5(2) | 1.00 |
| O(2) | 8c | 0.9366(5) | 0.263(3) | 0.244(5) | 0.3(2) | 1.00 |
| O(3) | 8c | 0.8227(6) | 0.450(2) | 0.011(4) | 0.8(2) | 1.00 |
| O(4) | 4b | 1/4 | 0.872(3) | 0.105(3) | 0.2(1) | 1.00 |

*The space group is Ima2 (No. 46) with the unit cell a = 22.696(4) Å, b = 5.484(4) Å, c = 5.385(4) Å.

TABLE IV

Selected Bond Angles (Degrees and Distances (Angstroms))

| | $LaSr_2Cu_2GaO_7$ | $HoSr_2Cu_2GaO_7$ |
|---|---|---|
| Cu-O1 | 1.958(5) | 1.94(2) |
| | 1.941(5) | 1.93(2) |
| Cu-O2 | 1.967(5) | 2.00(2) |
| | 1.957(5) | 1.88(2) |
| Cu-O3 | 2.342(2) | 2.37(1) |
| Ga-O3 | 1.831(2) × 2 | 1.80(1) × 2 |
| Ga-O4 | 1.909(6) | 1.92(1) |
| | 1.891(4) | 1.83(1) |
| Ln-O1 | 2.570(3) × 2 | 2.34(2) × 2 |
| | 2.605(3) × 2 | 2.47(2) × 2 |
| Ln-O2 | 2.533(3) × 2 | 2.38(2) × 2 |
| | 2.536(3) × 2 | 2.42(2) × 2 |
| Sr-O1 | 2.678(4) | 2.87(2) |
| | 2.705(4) | 2.74(2) |
| Sr-O2 | 2.660(4) | 2.74(2) |
| | 2.671(4) | 2.70(2) |
| Sr-O3 | 2.517(2) | 2.45(1) |
| | 2.967(5) | 2.83(2) |
| | 2.654(5) | 2.70(2) |
| Sr-O4 | 2.500(2) | 2.45(1) |
| O1-Cu-O1 | 89.0(1) | 88.4(1) |
| O1-Cu-O2 | 90.6(2) | 94.3(9) |
| | 90.9(2) | 86.2(9) |
| | 171.7(1) | 165.9(5) |
| | 171.7(1) | 166.3(5) |
| O2-Cu-O2 | 88.3(1) | 88.1(1) |
| O3-Ga-O3 | 130.5(2) | 132.6(9) |
| O3-Ga-O4 | 104.9(2) × 2 | 105.2(5) × 2 |
| | 103.7(1) × 2 | 102.7(7) × 2 |
| O4-Ga-O4 | 107.7(1) | 106.4(5) |

POLYCRYSTALLINE SPECIMEN ANALYSIS

Polycrystalline samples of $LnSr_2Cu_2GaO_7$ (Ln=La-Yb, Y) and "$LuSr_2Cu_2GaO_7$" were synthesized from stoichiometric mixtures of the component oxides and carbonates as above. The components were heated to 980° C. for three weeks with frequent grinding. Lattice parameters were determined from an X-ray Rietveld refinement of the structure with silicon as an internal standard and are summarized in Table V. All samples used for unit-cell determination were quenched to room temperature in air. Lattice constants for the holmium sample (see Table V) are from this study and not from the X-ray single-crystal analysis, where incorporation of aluminum during the crystal growth has slightly affected the lattice parameters. The lutetium compound was found not to form after prolonged heating (>three months). The resulting mixture was found to contain $Lu_2Cu_2O_3$, $Sr_3Ga_2O_6$, $SrCuO_2$ and $CuGa_2O_4$.

TABLE V

Lattice Constants for $LnSr_2Cu_3GaO_7$

| lanthanide (Ln) | a, Å | b, Å | c, Å |
|---|---|---|---|
| lanthanum | 23.160 (2) | 5.5706 (6) | 5.4782 (8) |
| cerium* | 22.968 (2) | 5.5451 (1) | 5.4400 (1) |
| praseodymium | 22.955 (1) | 5.5498 (1) | 5.4481 (2) |
| neodymium | 22.904 (1) | 5.5403 (1) | 5.4403 (1) |
| samarium | 22.850 (1) | 5.5192 (2) | 5.4245 (2) |
| europium | 22.839 (1) | 5.5188 (1) | 5.4208 (1) |
| gadolinium | 22.825 (1) | 5.5121 (2) | 5.4167 (2) |
| terbium | 22.827 (7) | 5.4975 (2) | 5.4057 (2) |
| dysprosium | 22.807 (1) | 5.4865 (3) | 5.4012 (4) |
| holmium | 22.818 (2) | 5.4738 (6) | 5.3906 (6) |
| yttrium | 22.815 (1) | 5.4800 (3) | 5.3928 (3) |
| erbium | 22.802 (1) | 5.4701 (1) | 5.3804 (1) |
| thulium | 22.806 (2) | 5.4911 (3) | 5.4035 (4) |
| ytterbium | 22.797 (1) | 5.4606 (2) | 5.3759 (2) |

*A small amount of cerium dioxide ($CeO_2$) was visible in the X-ray powder diffraction pattern.

MATRIX OF COMPOSITION PRODUCED

The search for optimal superconductors in Ga-Sr-RE-Ca-Cu systems were done for a variety of compositions and synthesis conditions. The basic phase space is defined as: composition-temperature-oxygen pressure. The range of compositions prepared include:

1) $Ga-Sr_2-Y_{1-x}-Ca_2-Cu-O_7$ system:
   (a) Ga $Sr_2Y_{1-x}Ca_xCu_2O_7$ with X: 0, 0.05, 0.1, 0.15, 0.20, 0.25, 0.3, 0.35, 0,4, 0.5, 0.6, 0.7
   (b) $Ga_{1-y}Sr_2YCu_{2+y}O_7$, Y: 0.1, 0.2, 0.3, 0.4, 0.5, 0.6, 0.7
   (c) $Ga_{1-y}Sr_2Y_{1-x}Ca_xCu_{2+y}O_7$, x=0.25 and y=0.1, 0.2, 0.3, 0.4, 0.5, 0.6; y=0.6 and x=0.1, 0.2, 0.3
   (d) $GaSr_{2-u}Y_{1-x}Ca_{u+x}Cu_2O_7$, x=0 and u=0.1, 0.2, 0.3, 0.4, 0.5, 1.0; x=0.2 and u=0.1, 0.2, 0.3; x=0.5 and u=0.5 and u=0.1, −0.1
2) $GaSr_2RE_{0.75}Ca_{0.25}Cu_2O_7$, RE=La, Pr, Nd, Sm, Eu, Gd, Tb, Dy, Ho, Er, Tm, Yb, Lu
3) $GaSr_2Yb_{1-x}Ca_xCu_2O_7$, (and the same for Dy) x=0, 0.1, 0.2, 0.3, 0.4, 0.5, 0.6, 0.7.
4) several permutations with Ba, Sr, Ca

TYPICAL METHOD OF SYNTHESIS

The typical synthesis procedure consisted of two steps: synthesis of the material and anneal under high oxygen pressure.

The synthesis procedures used for $GaSr_2Y_{1-x}Ca_xCu_2O_7$ system are as follows:

| 1st step | | 2nd step | | cooling rate | superconducting Tc for x = | | | | | |
|---|---|---|---|---|---|---|---|---|---|---|
| Temp [°C.] | P(O₂) | Temp [°C.] | P(O₂) | deg/min | 0.2 | 0.25 | 0.3 | 0.35 | 0.4 | 0.5 in Kelvin |

-continued

| | | | | | | | | | | |
|---|---|---|---|---|---|---|---|---|---|---|
| 980 | air | — | — | 2 | none | none | n | n | n | n |
| 980 | air | 910 | 200 atm. | 2 | — | 25 | — | — | — | — |
| 980 | air | 925 | 300 atm. | 2 | 25 | 25 | 25 | 25 | — | — |
| 980 | air | 925 | 300 atm. | 1 | — | 35 | 30 | 30 | 50 | 50 |
| 980 | air | 940 | 300 atm. | 1 | — | — | — | 70 | — | — |
| 980 | air | 980 | 500 atm. | 2 | — | 30 | 35 | 45 | 45 | — |
| 980 | air | 980 | 500 atm. | 0.3 | — | 35 | 50 | 50 | 50 | — |
| 980 | air | 1050 | 600 atm. | 1 | — | — | — | 50 | — | — |
| 980 | air | 1100 | 600 atm. | 1 | — | — | — | — | — | 50 |
| 980 | air | 1150* | 600 atm. | 1 | — | — | — | — | — | 70 |
| below are also the same for Ga $Sr_{1.9}$ $Y_{.6}$ $Ca_{.4}$ $Cu_2$ $O_7$ | | | | | | | | | | |
| 960 | 1 atm. | 940 | 280 atm. | 1 | — | — | — | — | 40 | — |
| 970 | 1 atm. | 925 | 270 atm. | 1 | — | — | — | — | 30 | — |
| 975 | 1 atm. | 940 | 280 atm. | 1 | — | — | — | — | 45 | — |
| 980 | 1 atm. | — | — | 2 | — | — | — | — | none | — |
| 1010* | 1 atm. | 940 | 280 atm. | 1 | — | — | — | — | 55 | — |
| 985 | 1 atm. | 940 | 270 atm. | 1 | — | — | — | — | 45 | — |
| 990 | 1 atm. | 940 | 270 atm. | 1 | — | — | — | — | 45 | — |
| 1005 | 1 atm. | 940 | 270 atm. | 1 | — | — | — | — | 50 | — |
| 850 | $10^{-5}$ atm. | 940 | 280 atm. | 1 | — | — | — | — | 35 | — |
| 980 | 0.2 atm. | 925 | 270 | 1 | — | — | — | — | 70 | — |
| 950 | 0.2 atm. | 940 | 270 | 1 | — | — | — | — | 50 | — |
| 950 | 0.005 atm. | 940 | 270 | 1 | — | — | — | — | 70 | — |
| 975 | 0.02 atm. | 940 | 270 | 1 | — | — | — | — | 65 | — |
| 975 | 0.005 atm.-decomposed | | | | | | | | | |
| 950 | 0.04 atm. | | | | | | | | | |
| 970* | 0.04 atm. | | | | | | | | | |
| 925 | 0.05 atm. | | | | | | | | | |
| 900 | 0.1 atm. | | | | | | | | | |

*— denotes temp. exceeding melting.

And for the Ga $Sr_2$ $RE_{0.75}$ $Ca_{0.25}$ $Cu_2$ system:

| RE | Tc[K] 1-step: air, 980° C., 2 deg/min 2-step: none; 960° C., 270 atm 1 deg/min | | Tc[K] 0.02 atm, 975° C. 960° C., 270 atm, 1 deg/min |
|---|---|---|---|
| La | no Tc | 25K | 45K |
| Pr | no | no | 25 |
| Nd | no | no | 45 |
| Sm | no | 25 | 45 |
| Eu | no | 20 | 40 |
| Gd | no | no | 20 |
| Tb | no | 25 | 35 |
| Dy | no | 20 | — |
| Ho | no | 35 | 50 |
| Er | no | 25 | 60 |
| Tm | no | 35 | 70 |
| Yb | no | 40 | — |
| $Yb_{.8}Ca_{.2}$ | — | — | 70 |
| $Yb_{.7}Ca_{.3}$ | — | — | 75 |
| $Yb_{.6}Ca_{.4}$ | — | — | 75 |

Fast cooling of a sample means the sample was removed from the furnace and cooled on a copper plate at about ~100 Deg/sec. Other cooling rates are specified in the Tables.

SUPERCONDUCTING CERAMIC STRUCTURE ANALYSIS

While not being limited, it is believed the $LnSr_2Cu_2GaO_7$ (Ln=La-Yb, Y) structure is best described as the replacement of the square-planar copper in the $YBa_2Cu_3O_7$ structure with a tetrahedral gallium. The replacement creates a large supercell of the ideal, cubic perovskite lattice ($a_p$) where $a \simeq 6a_p$, $b \simeq \sqrt{2}a_p$ and $c \simeq \sqrt{2}a_p$. The $Ln^{3+}$ and $Sr^{2+}$ "A" type cations both occupy eight-coordinate sites. The lanthanide cations preferentially occupy a 4+0+4 coordination environment between the $CuO_{4/2}$ planes. The strontium is in a more distorted 4+3+1 environment. The coordination environment of the A type cations is described by three numbers: the first denotes the number of oxygen atoms from the $CuO_{4/2}$ layer, the second the number from $AO_{4/4}$ layer, and the third number from either the $GaO_{4/2}$ layer (strontium) or the $CuO_{4/2}$ layer (lanthanide). Because the coordination numbers are the same for both A cations, extensive site mixing between the A cations should be expected for the larger lanthanides, which are similar in size to strontium. Less mixing should be expected for the smaller lanthanides. On the basis of the neutron diffraction study of $LaSr_2Cu_2GaO_7$, lanthanum ($La^{3+}$, 1.16 Å; $Sr^{2+}$ 1.26 Å) was found to preferentially occupy site 4a between the copper square pyramids in a 70/30 ratio. The strontium preferentially was on site 8c nearer the $GaO_{4/2}$ tetrahedra. The scattering lengths for lanthanum (8.24 fm) and strontium (7.02 fm) are sufficiently different so that a refinement of possible site mixing can be done confidently. In the X-ray single-crystal structure refinement of $HoSr_2Cu_2GaO_7$, where ordering strongly affects the intensities, the A type cation positions were found not to be disordered, in contrast to the lanthanum compound, but occupy distinct sites. Apparently the holmium atom (1.01 Å) is small enough so that site mixing is not favored. This is consistent with the large (0.25 Å) size difference causing site specificity, although thermodynamic factors including growth temperature, oxygen partial pressure, and sample history can also affect cation ordering.

The copper coordination for the lanthanum and holmium compounds was found to be square pyramidal with four short in-plane distances averaging 1.96 and 1.94 Å and one long apical bond of 2.34 and 2.47 Å, respectively. FIG. 1 shows the structure of the LaSr$_2$Cu$_2$GaO$_7$. Table IV contains bond angles and distances for both compounds. Doping (p-type) studies on a number of these compounds indicate that strontium and calcium, but not barium, can substitute for the lanthanide on the A type site or zinc can substitute on the B site. The oxygen stoichiometry of these compounds has not been thoroughly investigated, but it is clear that oxygen vacancies, if they occur, form in the plane in contrast to YBa$_2$Cu$_3$O$_7$.

MAGNETIC SUSCEPTIBILITY ANALYSIS

Susceptibility measurements were performed on a Quantum Design Corp MPMS Squid Susceptometer between 4 and 300 K. A platinum metal standard was used for instrument calibration. The measurements were done with polycrystalline samples encased in sealed gelatin caps. The data were corrected for the diamagnetism of the sample holder. A 1-kG field was used for all measurements unless otherwise noted.

Figure 8:
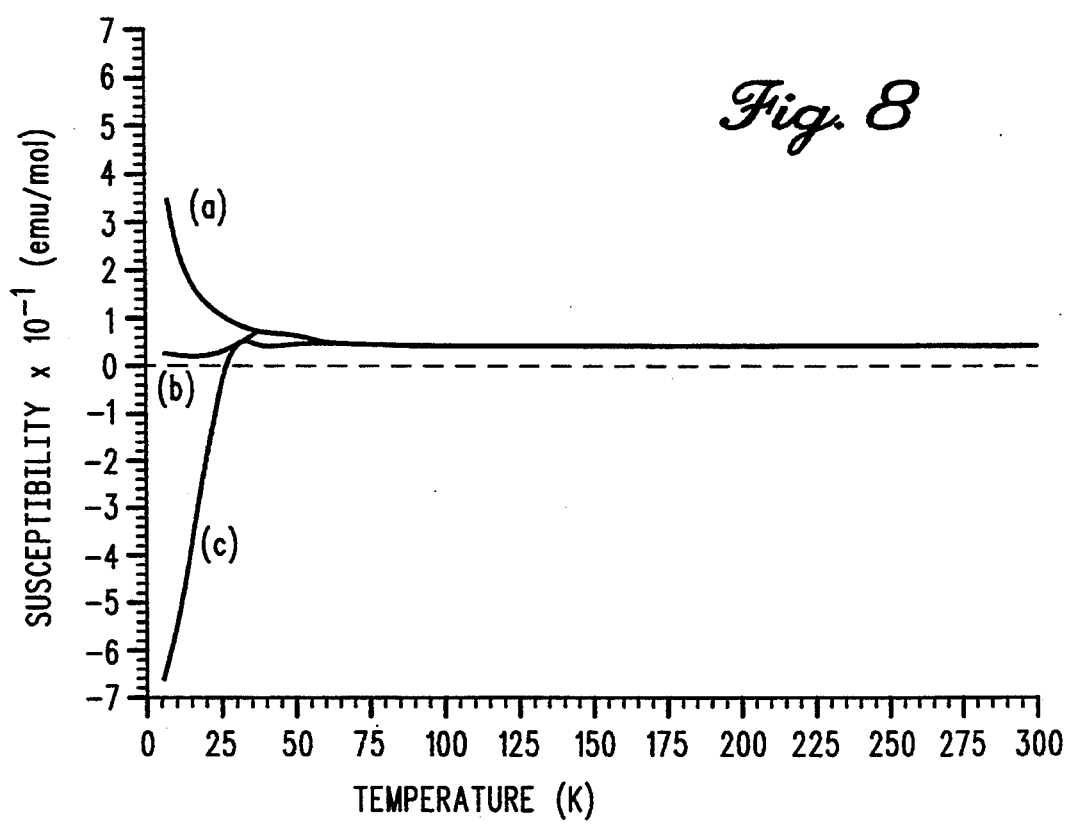
FIG. 8 shows susceptibility of $Y_{0.8}Ca_{0.2}Sr_2Cu_2GaO_7$ in the range of 4°–300° K. with curve (a) the quenched sample, (b) the slow cooled sample in air, and (c) after high pressure oxygen annealing.
Figure 9:
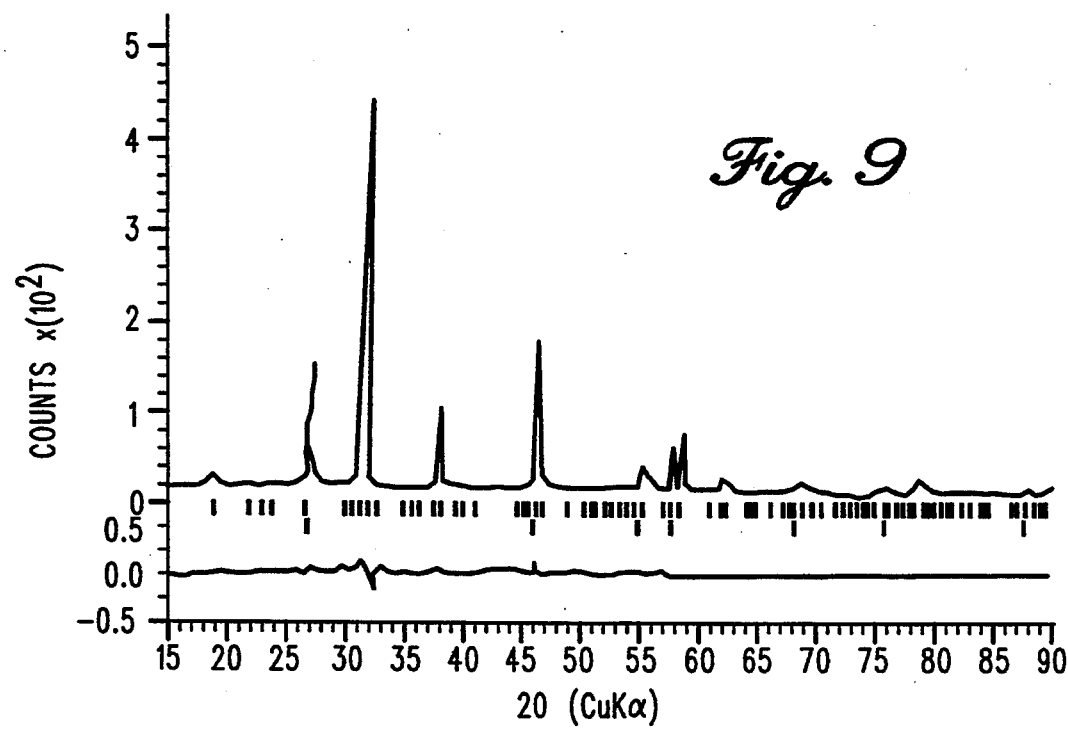
FIG. 9 illustrates an X-ray diffraction pattern for x=0.35 high pressure annealed sample.

The system Y-Sr-Cu-Ga-O was chosen as a candidate for superconductivity because of the shorter Cu-O in-plane distances and the cation ordering observed in the structural studies (neutron and X-ray). Magnetic susceptibility experiments were performed on all samples. All samples were found to remain paramagnetic down to 4 K when quenched to room temperature in air. It was found that when doped with calcium, i,e., Y$_{1-x}$Ca$_x$Sr$_2$Cu$_2$GaO$_7$ (x=0.20), a superconducting transition at about 30 K was observed when annealed in high-pressure oxygen at about 910° C. (12 hours, 200 bar) and cooled to room temperature (about 2° C./min). A plot of susceptibility versus temperature is shown in FIG. 8. An indexed powder pattern of the sample is reported in Table VI. Excellent agreement between the observed X-ray powder diffraction data and the expected lines (see FIG. 9) based on the orthorhombic Ima2 model indicates that the high-pressure oxygen treatment did not cause decomposition.

TABLE VI

Indexed X-Ray Diffraction Pattern of Y$_{0.80}$Ca$_{0.20}$Sr$_2$Cu$_2$GaO$_7$*

| h | k | l | d$_{Riet}$ | I/I$_o^c$ | h | k | l | d$_{Riet}$ | I/I$_o^c$ |
|---|---|---|---|---|---|---|---|---|---|
| 2 | 0 | 0 | 7.74 | 8 | 10 | 0 | 2 | 1.740 | 1 |
| 4 | 0 | 0 | 5.703 | <1 | 5 | 3 | 0 | 1.694 | 2 |
| 1 | 1 | 0 | 5.323 | 1 | 4 | 1 | 3 | 1.634 | 2 |
| 3 | 1 | 0 | 4.442 | 3 | 14 | 0 | 0 | 1.629 | 3 |
| 0 | 1 | 1 | 3.838 | 2 | 7 | 3 | 0 | 1.592 | 1 |
| 6 | 0 | 0 | 3.802 | <1 | 6 | 3 | 1 | 1.573 | 14 |
| 2 | 1 | 1 | 3.638 | 3 | 12 | 2 | 0 | 1.561 | 4 |
| 5 | 1 | 0 | 3.505 | 3 | 6 | 1 | 3 | 1.556 | 16 |
| 4 | 1 | 1 | 3.184 | 5 | 12 | 0 | 2 | 1.553 | 4 |
| 8 | 0 | 0 | 2.852 | <1 | 14 | 1 | 1 | 1.499 | 3 |
| 7 | 1 | 0 | 2.800 | 2 | 8 | 3 | 1 | 1.478 | 5 |
| 0 | 2 | 0 | 2.737 | 28 | 10 | 2 | 2 | 1.469 | 2 |
| 6 | 1 | 1 | 2.701 | 100 | 8 | 1 | 3 | 1.464 | 4 |
| 0 | 0 | 2 | 2.692 | 31 | 5 | 3 | 2 | 1.434 | 1 |
| 2 | 2 | 0 | 2.661 | <1 | 14 | 2 | 0 | 1.400 | 4 |
| 2 | 0 | 2 | 2.620 | <1 | 14 | 0 | 2 | 1.394 | 3 |
| 4 | 2 | 0 | 2.467 | <1 | 0 | 4 | 0 | 1.369 | 3 |
| 4 | 0 | 2 | 2.436 | <1 | 2 | 4 | 0 | 1.359 | 1 |
| 1 | 2 | 1 | 2.426 | 1 | 12 | 2 | 2 | 1.351 | 6 |
| 3 | 2 | 1 | 2.323 | 1 | 0 | 0 | 4 | 1.346 | 3 |
| 3 | 1 | 2 | 2.302 | 1 | 16 | 1 | 1 | 1.336 | 4 |
| 8 | 1 | 1 | 2.289 | 22 | 14 | 2 | 2 | 1.242 | 5 |
| 10 | 0 | 0 | 2.281 | 4 | 0 | 4 | 2 | 1.219 | 2 |
| 6 | 2 | 0 | 2.221 | 4 | 6 | 3 | 3 | 1.213 | 4 |
| 6 | 0 | 2 | 2.197 | 3 | 0 | 2 | 4 | 1.208 | 2 |
| 5 | 1 | 2 | 2.135 | 1 | 1 | 18 | 1 | 1.203 | 1 |
| 8 | 2 | 0 | 1.975 | 2 | 14 | 3 | 1 | 1.186 | 1 |
| 8 | 0 | 2 | 1.958 | 2 | 14 | 1 | 3 | 1.178 | 2 |
| 0 | 2 | 2 | 1.919 | 31 | 8 | 3 | 3 | 1.167 | 2 |
| 12 | 0 | 0 | 1.901 | 9 | 6 | 4 | 2 | 1.161 | 1 |
| 2 | 2 | 2 | 1.893 | 2 | 12 | 0 | 4 | 1.099 | 1 |
| 9 | 2 | 1 | 1.757 | 1 | 16 | 1 | 3 | 1.094 | 1 |
| 10 | 2 | 0 | 1.752 | 1 | 20 | 1 | 1 | 1093 | 3 |

*Orthorhombic; a = 22,813 (1) Å, b = 5.474 (1) Å, c = 5,384 (1) Å. Ima2 (No. 46).
$^b$Unobserved reflections (I/Io < 1%) after 40° 2θ are not listed.
$^c$The numbers listed are percentages.

DOPING OF COMPOSITIONS

Various doping studies have been carried out utilizing the crystallographic similarity of LnSr$_2$Cu$_2$GaO$_7$ and YBa$_2$Cu$_3$O$_7$. It was found that in the La$_{1-x}$Sr$_{2+x}$Cu$_2$GaO$_7$ system the solubility of excess strontium in the samples was about 15% which form the composition La$_{0.85}$Sr$_{2.15}$Cu$_2$GaO$_7$. All compositions measured remained semiconductors and paramagnetic down to 4 K. In the series HoSr$_2$Cu$_2$Ga$_{1-x}$Zn$_x$O$_7$, the samples also remained paramagnetic and semiconducting down to 4 K. A neutron diffraction study of the x=0.15 sample of the latter revealed that approximately 50% of the zinc was in the copper planes. Similar results have been observed in other layered cuprate systems when doped with zinc. The highest doping levels attainable were for the Y-Sr-Cu-Ga-O system doped with calcium, i.e., Y$_{1-x}$Ca$_x$Sr$_2$Cu$_2$GaO$_7$ (0≤x≤10.30). The composition Y$_{0.80}$Ca$_{0.20}$Sr$_2$Cu$_2$GaO$_7$ remained paramagnetic upon quenching to room temperature from 950° C., but slow cooling at 10° C./hour was found to greatly reduce the susceptibility of the sample. The sample was next heated under high oxygen pressure and temperature (200 bar, 910° C.) and allowed to slow cool at a rate of about 2° C./minute. A small, but significant, fraction of the sample was found to have a superconducting transition near 30 K. The measurement was performed in a 100-G field. Magnetization experiments (field±50,000 G) performed at 5 K revealed an H$_{c1}$ of about 400 G and an H$_{c2}$ of about 1800 G. We observe (see Tables V and VI) that the lattice constants of the doped, high-pressure annealed sample contract in the plane of the copper oxygen layers (b, c axes). This is expected when electrons are removed from the antibonding orbitals increasing the overlap of the in-plane copper oxygen orbitals.

CRITICAL CURRENT ANALYSIS (Ga-Sr-Y-Cu-O SYSTEM)

The critical current values were determined from magnetic measurements within Bean's model. The hysteresis of the magnetic moment was measured at 5, 20 and 35 Kelvin. The magnetization hysteresis measurements for the entire and divided sample indicate granularity, i.e., the current loop size is limited by the grain size (1.5–1.8 μm). The calculated J$_c$'s values are as follow:

1) in H=O T field: J$_c$6.7, 0.3 and 0.2×10$^5$ a/cm$^2$ for T=5, 20 and 35 Kelvin, respectively.
2) in H=0.5 T field: J$_c$=5.1, 0.4 and 0.2×10$^5$ A/cm$^2$ for T=5, 20 and 35 Kelvin respectively.

What is claimed is:

1. A method of preparing a high temperature superconducting ceramic in the system comprising Ga, Sr, Ln, Cu, and O, wherein Ln is a lanthanide element, comprising the steps of:

heating to a first temperature a mixture comprised of materials including Ga, Sr, Ln and Cu of predetermined amounts to enable obtaining the stoichiometry present in the ceramic system including Ga, Sr, Ln, Cu and O;

cooling said mixture to form a starting material comprised of the combined materials; and heating said starting material at a second temperature in an oxygen containing environment to produce said high temperature superconducting ceramic.

2. The method as defined in claim 1 wherein said second temperature is about 910° C. up to about 1100° C. for said Ga, Sr, Ln, Cu, and O ceramic system.

3. The method as defined in claim 1 wherein said oxygen is present in a pressure range of about 100–600 atm.

4. The method as defined in claim 1 where said mixture comprises at least one oxide and at least one carbonate.

5. The method as defined in claim 2 wherein said superconducting ceramic further includes Ca.

6. The method as defined in claim 2 wherein said crystalline material comprises a high temperature ceramic superconductor based on $GaSr_2Ln_{1-x}M_x\text{-}Cu_2O_{7\pm w}$ wherein $0.2 \leq x \leq 0.4$ and M is selected from the group consisting of Ca and Sr and Ln is a lanthanide selected from the group consisting of La, Ce Pr, Sm, Eu, Gd, Tb, Dy, Ho, Er, Tm, Yb, and Y.

7. The method as defined in claim 1, further including the step of grinding said fired crystalline material prior to heating the material.

8. The method as defined in claim 1 wherein said Ga, Sr, Ln, Cu and O containing system comprises $Ga_{1-y}Sr_2YCu_{2+y}O$ with y about 0.6–0.65.

9. The method as defined in claim 1 further including the final step of slow cooling after said heating step.

10. The method as defined in claim 9 wherein said slow cooling step is about 2° C./minute or less.

11. The method as defined in claim 8 wherein said Ln is selected from the group consisting of La, Ce, Pr, Sm, Eu, Gd, Tb, Dy, Ho, Er, Tm, Yb and Y.

12. The method as defined in claim 1 wherein said cooling is performed at cooling rates less than about 5° C./minute.

13. The method as defined in claim 1 wherein said first temperature is greater than about 800° C. and less than about $T_{mp}$ plus 100° C.

14. The method as defined in claim 1 wherein said oxygen containing environment consists essentially of pure oxygen at partial pressures greater than about 150 atmospheres.

15. The method as defined in claim 1 wherein said heating step activates the superconducting state of matter of said crystalline material.

16. The method as defined in claim 1, further including the step of using a dopant atom to dope said crystalline material, said dopant atom selected from the group consisting of Ca and O, to activate the superconducting state of matter of said crystalline material.

17. The method as defined in claim 1 wherein said high temperature superconducting ceramic consists essentially of compositions between $Ga_{0.3}Sr_2YCu_{2.7}O_7$ to $Ga_{0.4}Sr_2YCu_{2.6}O_7$.

* * * * *

UNITED STATES PATENT AND TRADEMARK OFFICE
CERTIFICATE OF CORRECTION

PATENT NO. : 5,374,611

DATED : December 20, 1994

INVENTOR(S) : Bogdan Dabrowski et al.

It is certified that error appears in the above-identified patent and that said Letters Patent is hereby corrected as shown below:

Title page, Abstract, Line 3, cancel "Pt" and insert -- Pr --;

Abstract, Line 6, cancel "$0.2 \stackrel{\leq}{=} x \stackrel{\leq}{=} 0.4$" and insert -- $0.2 \leq x \leq 0.4$ --;

Column 1, Line 21, cancel "$0.2 \stackrel{\leq}{=} x \stackrel{\leq}{=} 0.4$" and insert -- $0.2 \leq x \leq 0.4$ --;

Column 1, Line 29, cancel "A-Ba" and insert -- A=Ba --;

Column 2, Line 56, after "dense" insert -- $GaSr_2Ln_{1-x}Ca_xCu_2O_7$ --;

Column 2, Line 62, after "field" insert -- (Gauss) --;

UNITED STATES PATENT AND TRADEMARK OFFICE
CERTIFICATE OF CORRECTION

PATENT NO. : 5,374,611

DATED : December 20, 1994

INVENTOR(S) : Bogdan Dabrowski et al.

Figure 6A:
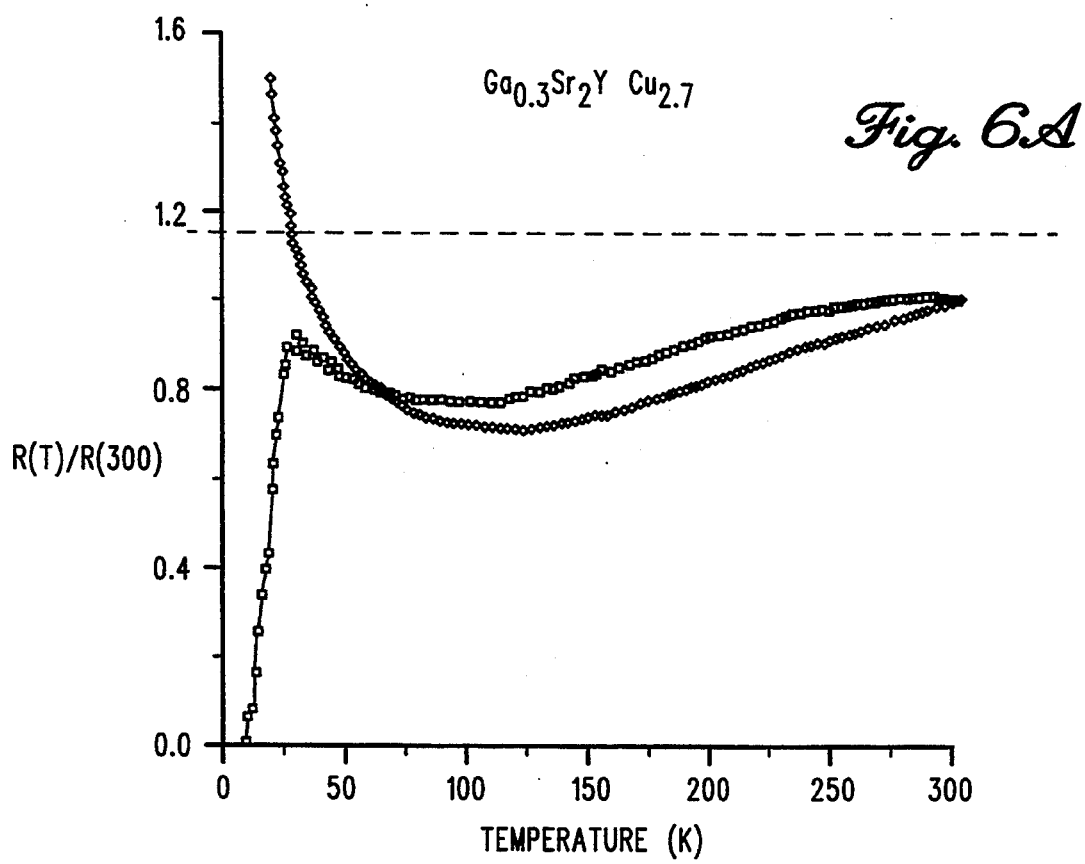
FIG. 6 shows relative normalized resistance versus temperature for various annealing and cool down conditions as well as different x values for the stoichimetry.
Figure 6B:
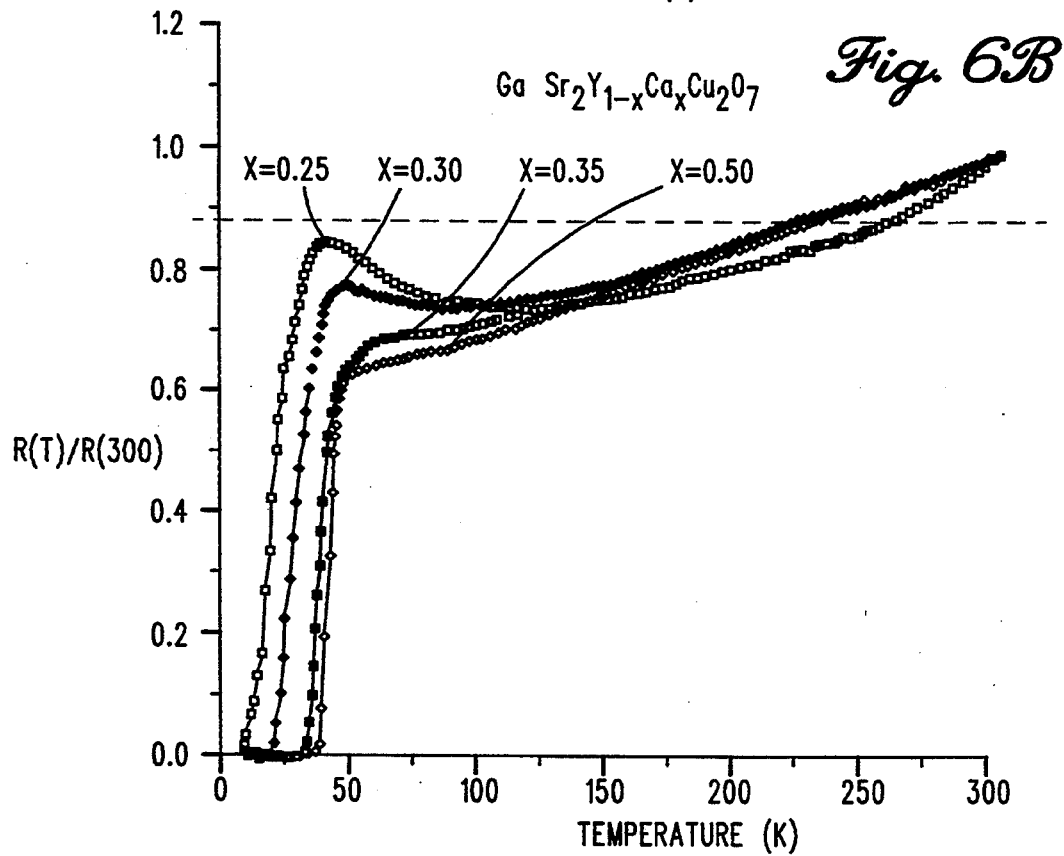
Figure 6C:
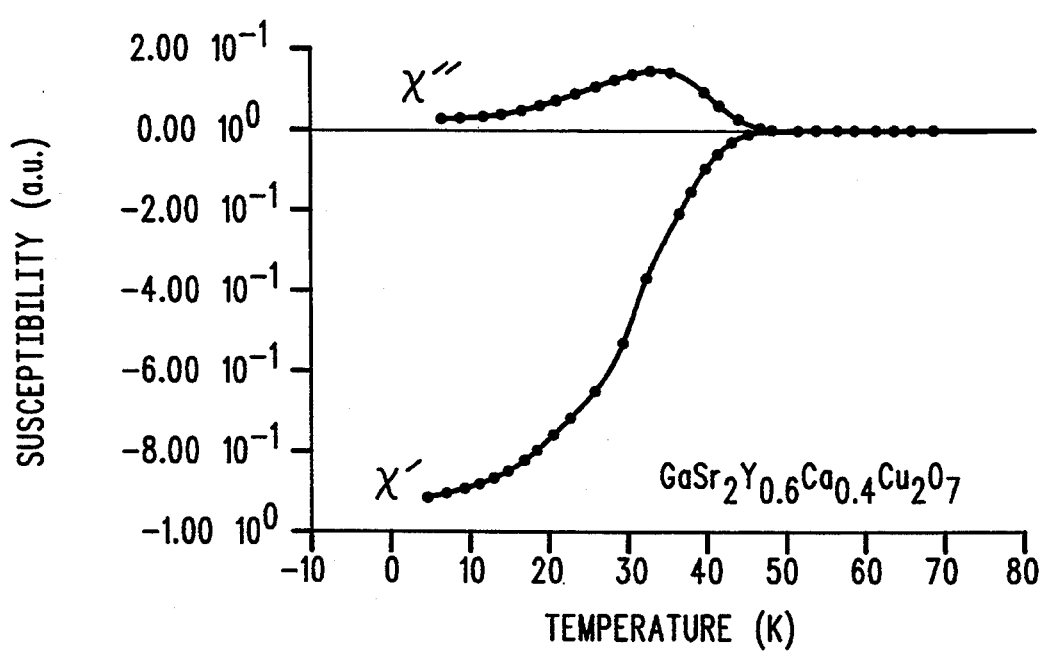

It is certified that error appears in the above-identified patent and that said Letters Patent is hereby corrected as shown below:

Column 3, Lines 3-5, cancel "FIG. 6 shows relative normalized resistance versus temperature for various annealing and cool down conditions as well as different x values for the stoichimetry;" and insert -- FIGURE 6A illustrates relative normalized resistance versus temperature for $Ga_{0.3}Sr_2YCu_{2.7}O_7$ for a specimen slow cooled in air (top curve) and a sample prepared using a 270 bar atmosphere of oxygen; FIG. 6B illustrates normalized resistance for $GaSr_2Y_{1-x}Ca_xCu_2O_7$ for different x values; and FIG. 6C shows susceptibility measurements for $GaSr_2Y_{0.6}Ca_{0.4}Cu_2O_7$; --;

Column 3, Line 14, after "sample" insert -- of $Y_{0.65}Ca_{0.35}Sr_2Ca_2GaO_7$ --;

UNITED STATES PATENT AND TRADEMARK OFFICE
CERTIFICATE OF CORRECTION

PATENT NO. : 5,374,611

DATED : December 20, 1994

INVENTOR(S) : Bogdan Dabrowski et al.

It is certified that error appears in the above-identified patent and that said Letters Patent is hereby corrected as shown below:

| | |
|---|---|
| Column 3, Line 16, | after "system" insert -- filled circles are for a single phase and open circles are for some impurity present --; |
| Column 3, Line 24, | cancel "Ln-La" and insert -- Ln=La --; |
| Column 3, Line 56, | cancel "($0 \leq x \leq 0.4$)" and insert -- ($0 \leq x \leq 0.4$) --; |
| Column 4, Line 3, | cancel "$0 \leq x \leq 0.25$" and insert -- $0 \leq x \leq 0.25$ --; |
| Column 4, Line 10, | cancel x $\geq$ 20.25" and insert -- x $\geq$ 0.25 --; |
| Column 4, Line 24, | cancel "$\leq 1$" and insert -- $\leq 1$ --; |
| Column 5, Line 36, | cancel "$0 \leq y \leq 0.7$" and insert -- $0 \leq y \leq 0.7$ --; |

UNITED STATES PATENT AND TRADEMARK OFFICE
CERTIFICATE OF CORRECTION

PATENT NO. : 5,374,611
DATED : December 20, 1994
INVENTOR(S) : Bogdan Dabrowski et al.

It is certified that error appears in the above-identified patent and that said Letters Patent is hereby corrected as shown below:

Column 6, Line 68, cancel "$\leqq d \leqq$" and insert -- $\leq d \leq$ --;

Column 7, Line 47, cancel "hk0:h+k+2n:h00:h=2n;" and insert -- hk0:h+k=2n:h00:h=2n; --;

Column 14, Line 31, cancel "$(0 \leqq x \leqq 10.30)$" and insert -- $(0 \leq x \leq 0.30)$ --;

Column 15, Line 27, cancel "$0.2 \leqq x \leqq 0.4$" and insert -- $0.2 \leq x \leq 0.4$ --;

Column 15, Line 32, cancel "fired"

Signed and Sealed this

Eleventh Day of April, 1995

Attest:

*Attesting Officer*

BRUCE LEHMAN
*Commissioner of Patents and Trademarks*